(12) United States Patent
Zhang et al.

(10) Patent No.: US 11,189,665 B2
(45) Date of Patent: Nov. 30, 2021

(54) PIXEL ARRANGEMENT FOR DISPLAY PANEL AND DISPLAY DEVICE

(71) Applicant: Wuhan Tianma Micro-Electronics Co., Ltd., Wuhan (CN)

(72) Inventors: Yi Zhang, Wuhan (CN); Zhiqiang Xia, Wuhan (CN); Ruiyuan Zhou, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 11 days.

(21) Appl. No.: 16/734,896

(22) Filed: Jan. 6, 2020

(65) Prior Publication Data

US 2021/0098539 A1 Apr. 1, 2021

(30) Foreign Application Priority Data

Sep. 30, 2019 (CN) .......................... 201910945535.9

(51) Int. Cl.
*H01L 27/32* (2006.01)

(52) U.S. Cl.
CPC ...... *H01L 27/3216* (2013.01); *H01L 27/3218* (2013.01); *H01L 27/3248* (2013.01); *H01L 27/3276* (2013.01)

(58) Field of Classification Search
CPC ............. H01L 27/3216; H01L 27/3218; H01L 27/3248; H01L 27/3276
See application file for complete search history.

(56) References Cited

U.S. PATENT DOCUMENTS

| | | | | |
|---|---|---|---|---|
| 8,896,200 | B2* | 11/2014 | Huang | .................... F21V 21/00 |
| | | | | 313/504 |
| 2009/0109172 | A1* | 4/2009 | Lee | ........................ G09G 3/344 |
| | | | | 345/107 |
| 2009/0121983 | A1* | 5/2009 | Sung | ................... H01L 27/3218 |
| | | | | 345/76 |

(Continued)

FOREIGN PATENT DOCUMENTS

| | | |
|---|---|---|
| CN | 103311266 A | 9/2013 |
| CN | 105448951 A | 3/2016 |

(Continued)

OTHER PUBLICATIONS

Chinese Office Action for related Chinese Application No. 201910945535.9; dated Jun. 16, 2021.

*Primary Examiner* — Lex H Malsawma
(74) *Attorney, Agent, or Firm* — von Briesen & Roper, s.c.

(57) ABSTRACT

Provided are a display panel and a display device. In a repeating unit of the display panel, two first sub-pixels and two second sub-pixels form an arrangement with two rows and two columns, a row direction and a column direction of the arrangement are parallel to a row direction and a column direction of a matrix respectively, and two sub-pixels in a same row or a same column emit light of different colors. Outer edges of the two first sub-pixels and the two second sub-pixels are located on a same first virtual rectangle, and geometric centers of the two first sub-pixels and the two second sub-pixels form a first virtual parallelogram. Geometric centers of four third sub-pixels form a second virtual rectangle, and one side of the second virtual rectangle is parallel to the row direction or the column direction of the matrix.

14 Claims, 10 Drawing Sheets

(56) References Cited

U.S. PATENT DOCUMENTS

| | | | |
|---|---|---|---|
| 2011/0291549 A1* | 12/2011 | Kim | H01L 27/3218 |
| | | | 313/504 |
| 2011/0291550 A1* | 12/2011 | Kim | H01L 27/3216 |
| | | | 313/504 |
| 2014/0002427 A1* | 1/2014 | Yeo | G06F 3/016 |
| | | | 345/204 |
| 2016/0155776 A1* | 6/2016 | Kabe | H01L 27/3216 |
| | | | 257/89 |
| 2016/0155781 A1* | 6/2016 | Chaji | G09G 3/3607 |
| | | | 257/89 |
| 2017/0294491 A1* | 10/2017 | Jo | G09G 3/2003 |
| 2018/0166512 A1* | 6/2018 | Hack | H01L 27/3213 |
| 2018/0357953 A1* | 12/2018 | Hu | G09G 3/2003 |

FOREIGN PATENT DOCUMENTS

| | | |
|---|---|---|
| CN | 107968104 A | 4/2018 |
| CN | 108279539 A | 7/2018 |
| CN | 108364983 A | 8/2018 |

* cited by examiner

PIXEL ARRANGEMENT FOR DISPLAY PANEL AND DISPLAY DEVICE

CROSS-REFERENCES TO RELATED APPLICATIONS

This application claims priority to Chinese patent application No. CN201910945535.9 filed on Sep. 30, 2019, disclosure of which is incorporated herein by reference in its entirety.

TECHNICAL FIELD

Embodiments of the present disclosure relate to the field of display techniques and, in particular, to a display panel and a display device.

BACKGROUND

An organic light emitting display panel has advantages of self-luminescence without backlight, low power, high brightness and a small size, is widely applied to various electronic devices, and is favored by users.

A pixel arrangement manner directly affects display performance of the organic light emitting display panel. In order to obtain an organic light emitting display panel with a better display effect, the pixel arrangement manner has become a research hotspot in the current organic light emitting display field. In the related art, the organic light emitting display panel has various common pixel arrangement manners all of which cannot ensure good linearity of display pictures and high picture definition and softness, and provides a poor display effect.

SUMMARY

The present disclosure provides a display panel and a display device to improve a display effect of a display panel.

In a first aspect, embodiments of the present disclosure provide a display panel including a plurality of repeating units arranged in a matrix.

Each of the plurality of repeating units includes two first sub-pixels, two second sub-pixels and four third sub-pixels, and each of the two first sub-pixels, each of the two second sub-pixels and each of the four third sub-pixels emit light of different colors.

The two first sub-pixels and the two second sub-pixels form an arrangement with two rows and two columns, a row direction and a column direction of the arrangement are parallel to a row direction and a column direction of the matrix respectively, and two sub-pixels in a same row or a same column emit light of different colors. Outer edges of the two first sub-pixels and the two second sub-pixels are located on a same first virtual rectangle, and geometric centers of the two first sub-pixels and the two second sub-pixel form a first virtual parallelogram.

Geometric centers of the four third sub-pixels form a second virtual rectangle, and a side of the second virtual rectangle is parallel to the row direction or the column direction of the matrix.

A geometric center of the first virtual parallelogram coincides with a geometric center of one of the four third sub-pixels, and the other three of the four third sub-pixels are located on the second virtual rectangle and one side of the first virtual parallelogram facing away from a geometric center of the first virtual parallelogram.

In a second aspect, the embodiments of the present disclosure further provide a display device including the display panel described in the first aspect.

BRIEF DESCRIPTION OF DRAWINGS

Other features, objects and advantages of the present disclosure will become more apparent from a detailed description of non-restrictive embodiments with reference to the drawings.

DETAILED DESCRIPTION

Figure 1:
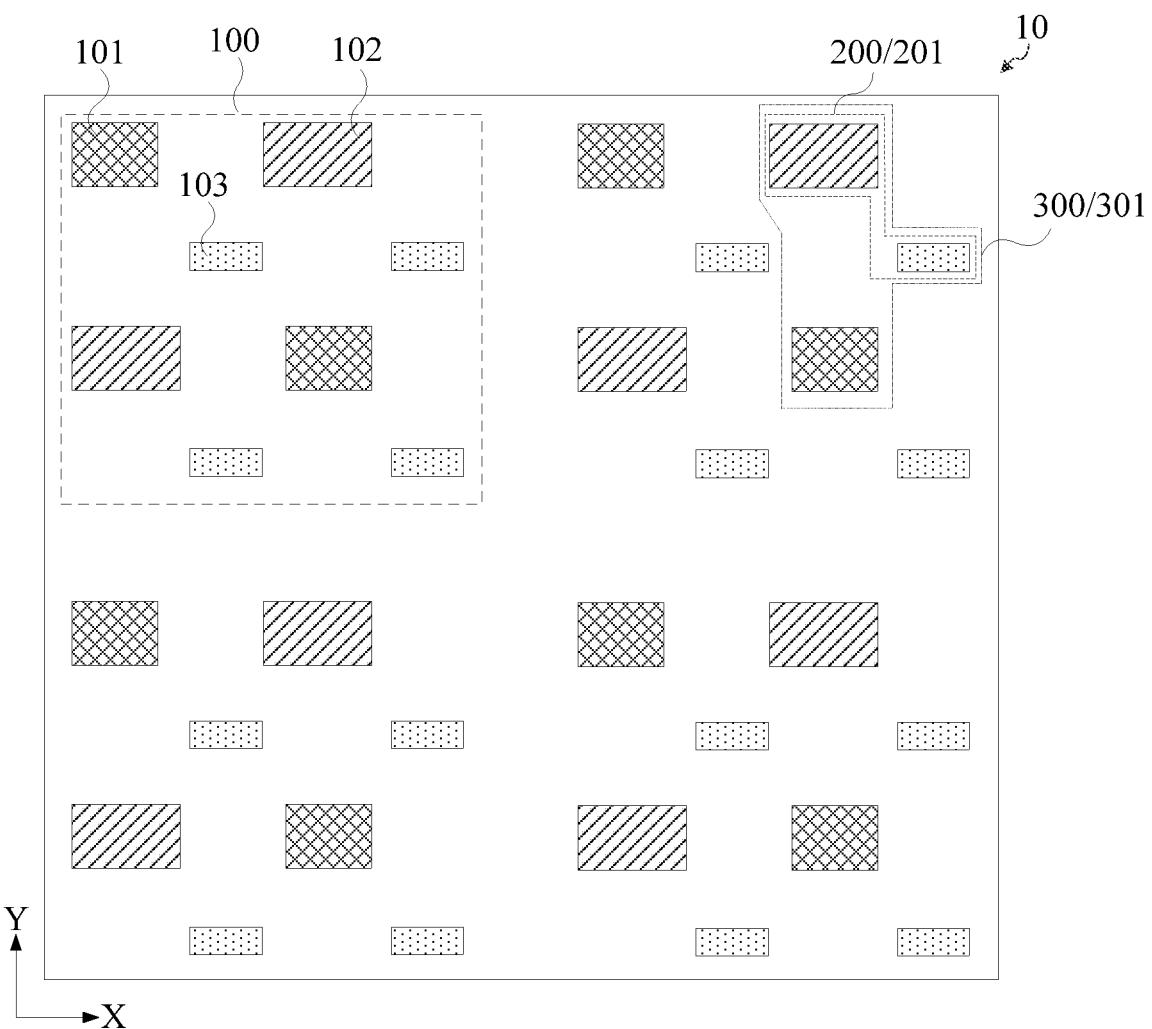
FIG. 1 is a structural diagram of a display panel according to an embodiment of the present disclosure.

To further elucidate technical means for achieving an intended purpose and technical effects there in the present disclosure, specific embodiments, structures, features and effects of a display panel and a display device according to the present disclosure will be described hereinafter in detail with reference to the accompanying drawings and preferred embodiments.

Embodiments of the present disclosure provide a display panel including a plurality of repeating units arranged in a matrix.

Each of the plurality of repeating units includes two first sub-pixels, two second sub-pixels and four third sub-pixels, where each of the two first sub-pixels, each of the two second sub-pixels and each of the four third sub-pixels emit light of different colors.

The two first sub-pixels and the two second sub-pixels form an arrangement with two rows and two columns, a row direction and a column direction of the arrangement are parallel to a row direction and a column direction of the matrix respectively, and two sub-pixels in a same row or a same column emit light of different colors. Outer edges of the two first sub-pixels and the two second sub-pixels are located on a same first virtual rectangle, and geometric centers of the two first sub-pixels and the two second sub-pixel form a first virtual parallelogram.

Geometric centers of the four third sub-pixels form a second virtual rectangle, and a side of the second virtual rectangle is parallel to the row direction or the column direction of the matrix.

A geometric center of the first virtual parallelogram coincides with a geometric center of one of the four third sub-pixels, and the other three of the four third sub-pixels are located on a side of the second virtual rectangle facing away from a geometric center of the second virtual rectangle.

The display panel provided by the embodiments of the present disclosure includes the plurality of repeating units arranged in the matrix, where in each of the plurality of repeating units, the outer edges of the two first sub-pixels and the two second sub-pixels are located on the same first virtual rectangle, the geometric centers of the two first sub-pixels and the two second sub-pixel form the first virtual parallelogram, and one of the four third sub-pixels located in the first virtual rectangle coincides with a geometric center of the first virtual rectangle. On one hand, along the row direction and the column direction of the matrix, the edges, facing away from the geometric center of the first virtual rectangle, of the first sub-pixel and the second sub-pixel which are adjacent to each other in the same repeating unit are flush, so that the display panel has better linearity of its display picture in the row direction and the column direction of the matrix, and the display picture will not have fuzzy jagged edges. On the other hand, because the third sub-pixel located at the geometric center of the first virtual parallelogram has similar distances from four sides of the first virtual parallelogram, light emitted by the third sub-pixel can be mixed with light emitted by the first sub-pixel and the second sub-pixel on each of the four sides of the first virtual parallelogram in a pixel rendering stage to obtain similar target white light, so that the display picture of the display panel is clearer. In addition, geometric centers of two first sub-pixels and two second sub-pixels in a same repeating unit form a parallelogram, so that visual centers of any two adjacent sub-pixels in the column direction of the matrix are misaligned, a color mixture degree of light emitted by sub-pixels with different light emitting colors is enhanced, and the display picture of the display panel is softer, effectively improving a display effect of the display panel.

The above is the core idea of the present application, and technical solutions in the embodiments of the present disclosure will be described clearly and completely in conjunction with the drawings in the embodiments of the present disclosure. Apparently, the embodiments described below are part, not all of the embodiments of the present disclosure. Based on the embodiments of the present disclosure, all other embodiments obtained by those skilled in the art without making creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the spirit of the present disclosure. Therefore, the present disclosure is not limited to the specific embodiments described below.

In addition, the present disclosure will be described in detail in conjunction with the schematic diagrams. In the detailed description of the embodiments of the present disclosure, for ease of description, schematic diagrams illustrating structures of devices and components are not partially enlarged in accordance with a general proportional scale. The schematic diagrams are merely illustrative and are not intended to limit the scope of the present disclosure. In addition, practical manufacturing includes three-dimensional spatial sizes: a length, a width and a height.

Figure 2:
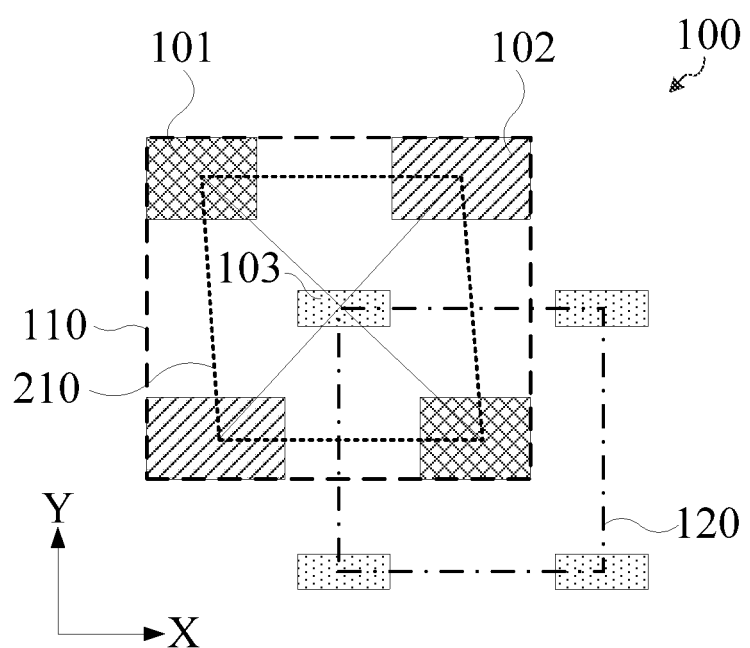
FIG. 2 is a structural diagram of a repeating unit according to an embodiment of the present disclosure.

FIG. 1 is a structural diagram of a display panel according to an embodiment of the present disclosure. As shown in FIG. 1, a display panel 10 includes a plurality of repeating units 100 arranged in a matrix. FIG. 2 is a structural diagram of a repeating unit according to an embodiment of the present disclosure. As shown in FIG. 2, each of the plurality of repeating units 100 includes two first sub-pixels 101, two second sub-pixels 102 and four third sub-pixels 013, where each of the two first sub-pixels 101, each of the two second sub-pixels 102 and each of the four third sub-pixels 103 emit light of different colors. Referring to FIG. 1 and FIG. 2, the two first sub-pixels 101 and the two second sub-pixels 102 form an arrangement with two rows and two columns, a row direction and a column direction of the arrangement are parallel to a row direction X and a column direction Y of the matrix respectively, and two sub-pixels in a same row or a same column emit light of different colors; outer edges of the two first sub-pixels 101 and the two second sub-pixels 102 are located on a same first virtual rectangle 110, and geometric centers of the two first sub-pixels 101 and the two second sub-pixels 102 form a first virtual parallelogram 210; geometric centers of the four third sub-pixels 103 form a second virtual rectangle 120, and a side of the second virtual rectangle 120 is parallel to the row direction X or the column direction Y of the matrix. Still referring to FIG. 2, a geometric center of the first virtual parallelogram 210 coincides with a geometric center of one of the four third sub-pixels 103, and the other three of the four third sub-pixels 103 are located on a side of the second virtual rectangle 120 facing away from a geometric center of the second virtual rectangle 120.

It should be noted that FIG. 1 merely illustrates that the display panel 10 including four repeating units 100 for description rather than limitations, and in other implementations of the present embodiment, the display panel 10 may further include another number of repeating units 100.

In addition, the first sub-pixel 101, the second sub-pixel 102 and the third sub-pixel 103 in the display panel 10 may have various shapes such as rectangles, and any solutions that may satisfy that the outer edges of the two first sub-pixels 101 and the two second sub-pixels 102 in the repeating unit 100 are located on the same first virtual rectangle 110 are within the scope of the present embodiment.

Figure 3:
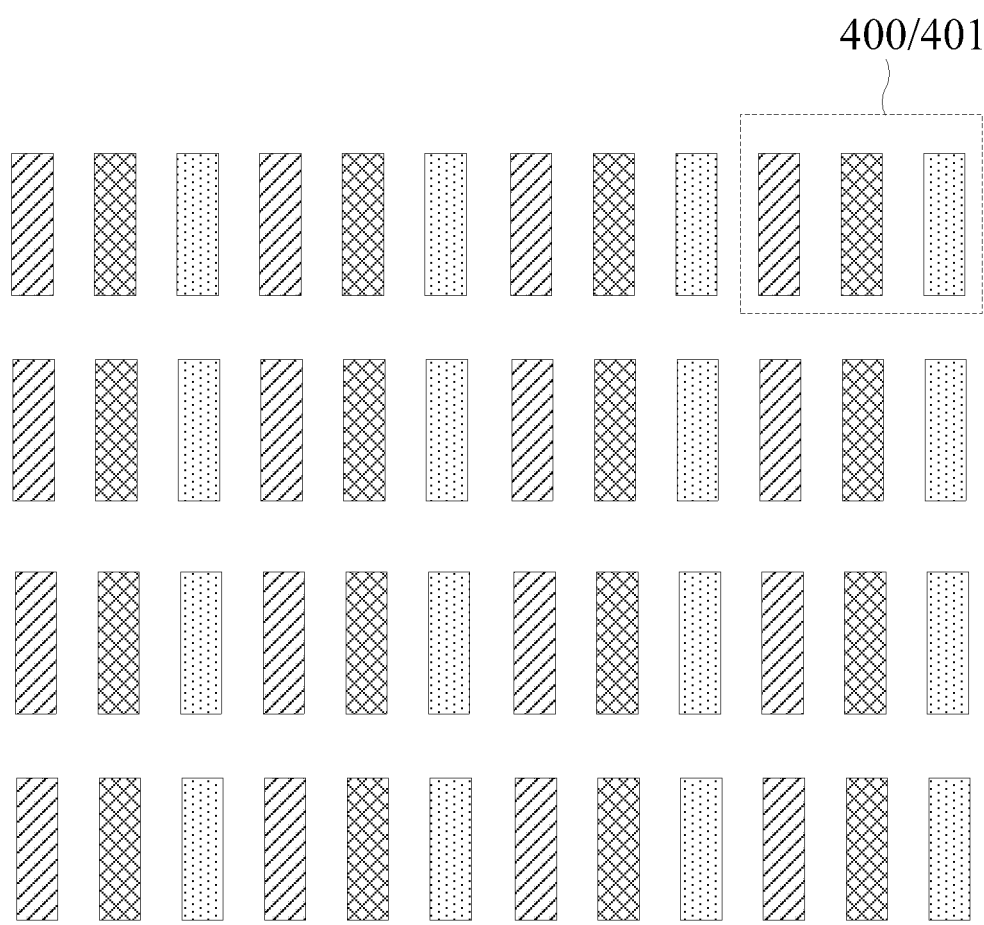
FIG. 3 is a structural diagram of a picture to be displayed according to an embodiment of the present disclosure.

It should be further noted that, as shown in FIG. 1, each third sub-pixel 103 forms a physical pixel unit 200 with the first sub-pixel 101 or the second sub-pixel 102 at an upper left corner of the third sub-pixel 103. In a pixel rendering process in a display stage, each physical pixel unit 200 forms a display pixel unit 300 with a sub-pixel of a third color on a same side of the physical pixel unit 200, and the display pixel unit 300 is configured to display content of an image pixel unit in a picture to be displayed, where the image pixel unit includes three sub-pixels whose colors are the same as light emitting colors of the first sub-pixel 101, the second sub-pixel 102 and the third sub-pixel 103 separately. It is to be understood that the display panel 10 including N repeating units 100 includes 4N physical pixel units 200 and may be configured to display the picture to be displayed including 4N image pixel units, where N is a positive integer. Exemplarily, the display panel 10 shown in FIG. 1 includes 16 physical pixel units 200, the picture to be displayed in FIG. 3 includes 16 image pixel units 400, and the display panel 10 shown in FIG. 1 may be configured to display content of the picture to be displayed in FIG. 2. Specifically, 16 physical pixel units 200 of the display panel 10 in FIG. 1 are arranged in 4 rows and 4 columns, 16 image pixel units 400 of the picture to be displayed in FIG. 3 are arranged in 4 rows and 4 columns, and a physical pixel unit 200 in an M-th row and a K-th column of the display panel 10 forms the display pixel unit 300 with a sub-pixel of the third color on a lower side of the physical pixel unit 200, where the display pixel unit 300 is configured to display content of an image pixel unit 400 in an M-th row and a K-th column of the picture to be displayed. For example, in FIG. 1, a physical pixel unit 200 in a first row and a fourth column of the display panel 10 is an A-type physical pixel unit 201, the A-type physical pixel unit 201 includes one second subpixel 102 and one third sub-pixel 103, the A-type physical pixel unit 201 forms an A-type display pixel unit 301 with a first sub-pixel 101 of a first color on a lower side of the A-type physical pixel unit 201, and the A-type display pixel unit 301 is configured to display content of an A-type image pixel unit 401 in a first row and a fourth column of the picture to be displayed in FIG. 3. It should be noted that a position of a sub-pixel with a third emitting color used by the physical pixel unit 200 is not specifically limited in the present embodiment, and the present embodiment merely illustrates that each physical pixel unit 200 uses the subpixel with the third emitting color on the lower side of the physical pixel unit 200 for description rather than limitations.

It can be seen that a pixel array of the display panel 10 can achieve beneficial effects of a low physical pixel density and a high display pixel density through pixel rendering, effectively improving the display effect of the display panel 10.

The display panel 10 provided by the present embodiment includes the plurality of repeating units 100 arranged in the matrix, where in each repeating unit 100, the outer edges of the two first sub-pixels 101 and the two second sub-pixels 102 are located on the same first virtual rectangle 110, the geometric centers of the two first sub-pixels 101 and the two second sub-pixel 102 form the first virtual parallelogram 210, and one of the four third sub-pixels 103 located in the first virtual rectangle 110 coincides with the geometric center of the first virtual rectangle 110. On one hand, along the row direction X and the column direction Y of the matrix, the edges facing away from the geometric center of the first virtual rectangle 110 of the first sub-pixel 101 and the second sub-pixel 102 which are adjacent to each other in the same repeating unit 100 are flush, so that the display panel 10 has better linearity of its display picture in the row direction X and the column direction Y of the matrix, and the display picture will not have fuzzy jagged edges. On the other hand, because the third sub-pixel 103 located at the geometric center of the first virtual parallelogram 210 has similar distances from the four sides of the first virtual parallelogram 210, light emitted by the third sub-pixel 103 can be mixed with light emitted by the first sub-pixel 101 and the second sub-pixel 102 on each of the four sides of the first virtual parallelogram 210 in a pixel rendering stage to obtain the similar target white light, so that the display picture of the display panel 10 is clearer. In addition, the geometric centers of two first sub-pixels 101 and two second sub-pixels 102 in the same repeating unit 100 form the parallelogram, so that the visual centers of any two adjacent sub-pixels in the column direction Y of the matrix are misaligned, the color mixture degree of light emitted by the sub-pixels with different light emitting colors is enhanced, and the display picture of the display panel 10 is softer, effectively improving the display effect of the display panel 10.

Figure 4:
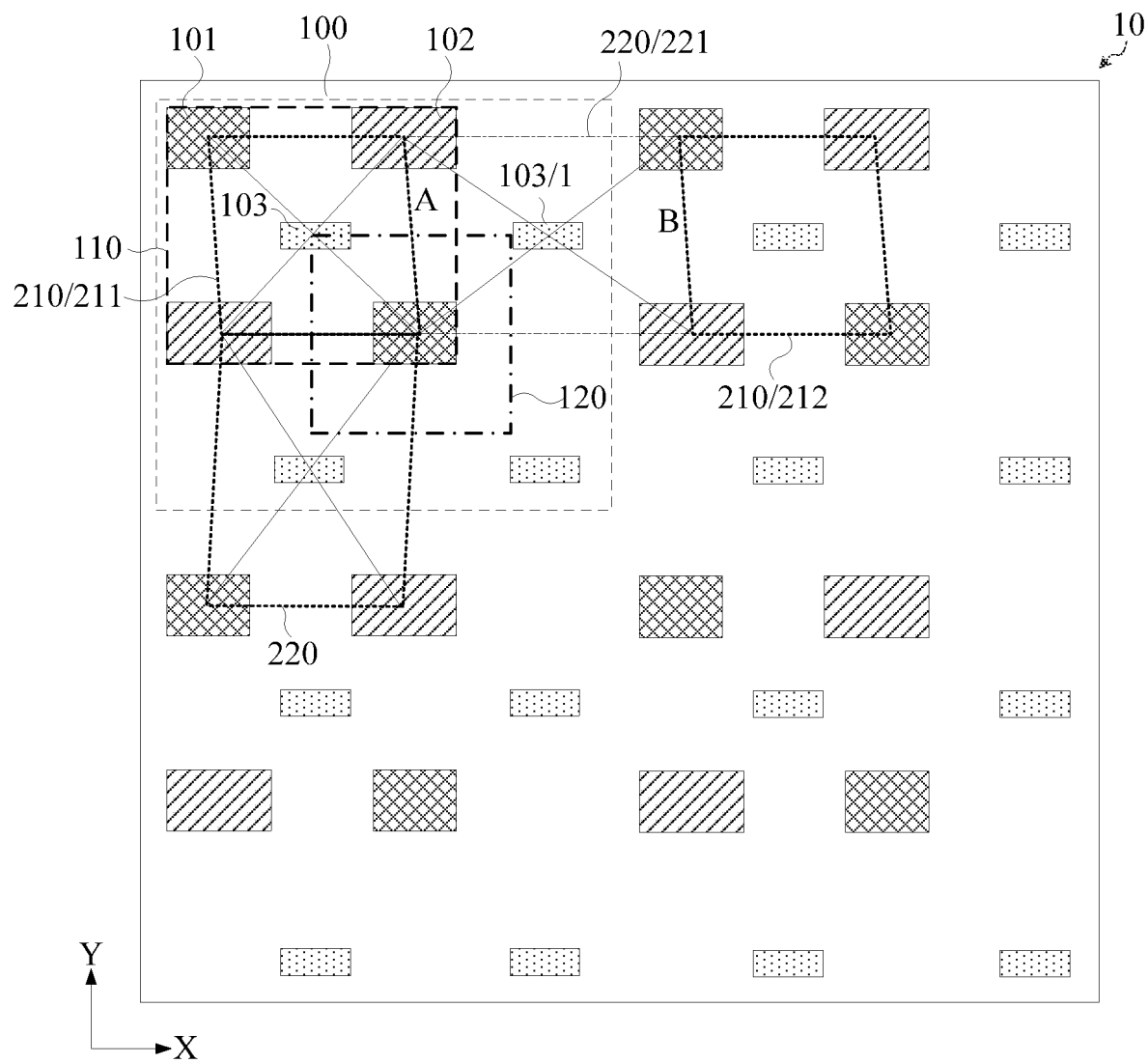
FIG. 4 is a structural diagram of another display panel according to an embodiment of the present disclosure.

FIG. 4 is a structural diagram of another display panel according to an embodiment of the present disclosure. A structure of the display panel 10 shown in FIG. 4 is similar to a structure of the display panel 10 shown in FIG. 1, and a difference lies in that in FIG. 4, along the row direction X and the column direction Y of the matrix, geometric centers of two first sub-pixels 101 and two second sub-pixels 102 located on opposite sides of two adjacent first virtual parallelograms 210 form a second virtual parallelogram 220, one third sub-pixel 103 is located inside the second virtual parallelogram 220, and a geometric center of the second virtual parallelogram 220 coincides with a geometric center of the third sub-pixel 103 inside the second virtual parallelogram 220.

Exemplarily, along the row direction X of the matrix, a first A-type virtual parallelogram 211 and a first B-type virtual parallelogram 212 are adjacent to each other, opposite sides of the first A-type virtual parallelogram 211 and the first B-type virtual parallelogram 212 are A and B, geometric centers of two first sub-pixels 101 and two second sub-pixels 102 located on A and B form a second A-type virtual parallelogram 221, and a geometric center of the second A-type virtual parallelogram 221 coincides with a geometric center of a third A-type sub-pixel 103/1 inside the second A-type virtual parallelogram 221.

It should be noted that with such an arrangement, the third sub-pixel 103 located at the geometric center of the second virtual parallelogram 220 has similar distances from four sides of the second virtual parallelogram 220, and light emitted by the third sub-pixel 103 may be mixed with light emitted by the first sub-pixel 101 and the second sub-pixel 102 on each of the four sides of the second virtual parallelogram 220 in the pixel rendering stage to obtain the similar target white light, further improving a definition of the display picture of the display panel 10.

Figure 5:
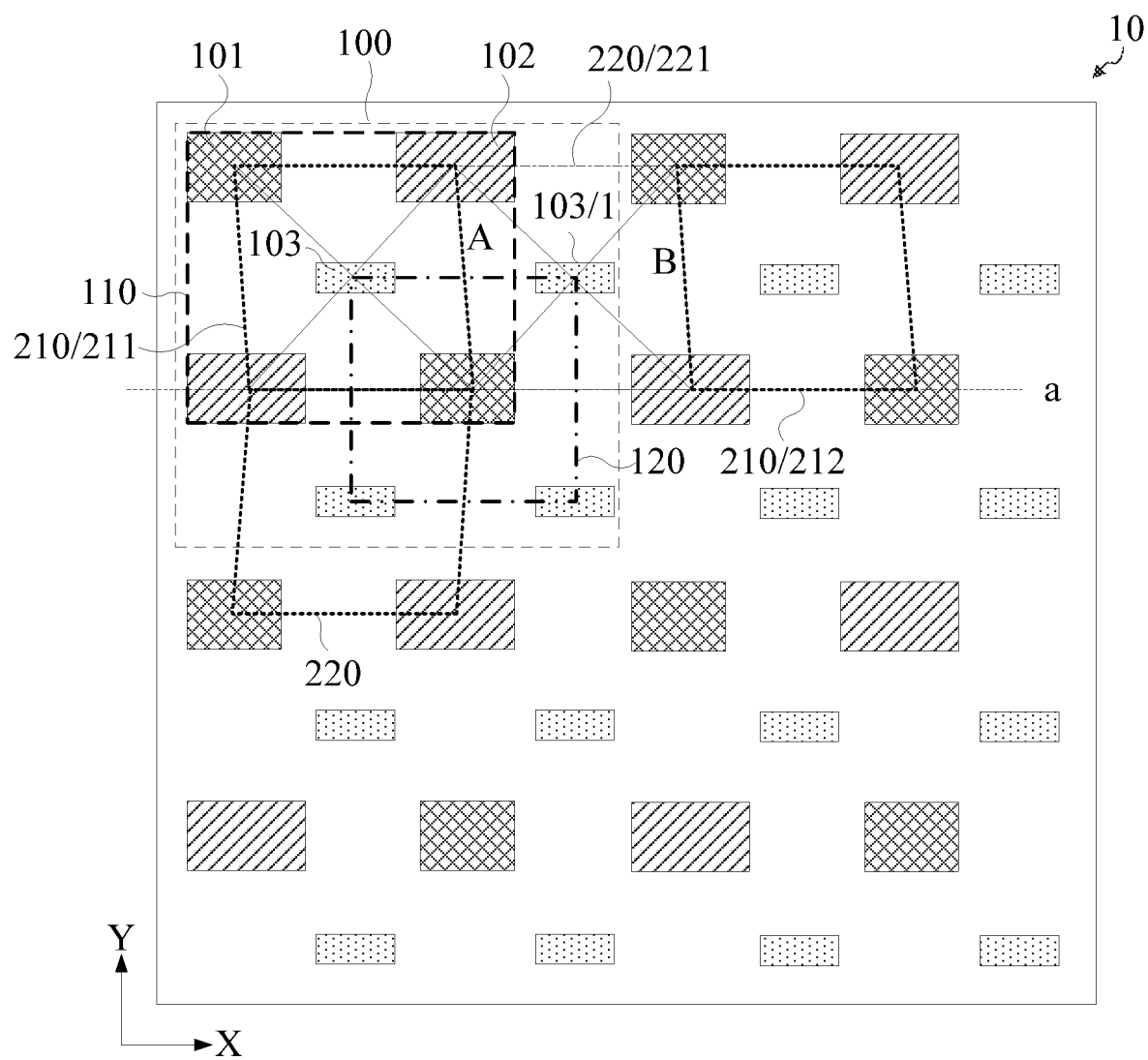
FIG. 5 is a structural diagram of another display panel according to an embodiment of the present disclosure.

Optionally, FIG. 5 is a structural diagram of another display panel according to an embodiment of the present disclosure. As shown in FIG. 5, based on the structure of the display panel 10 shown in FIG. 4, along the row direction X of the matrix, the first virtual parallelogram 210 and the second virtual parallelogram 220 adjacent to the first virtual parallelogram 21 coincide through a translation along the row direction X of the matrix; and along the column direction Y of the matrix, the first virtual parallelogram 210 and the second virtual parallelogram 220 adjacent to the first virtual parallelogram 210, are mirror-symmetrical about a virtual straight line a, where the virtual straight line a is parallel to the row direction of the matrix.

It should be noted that with such an arrangement, each third sub-pixel 103 has similar distances from four sides of the first virtual parallelogram 210 or the second virtual quadrangle 220 corresponding to the third sub-pixel 103, so that the definition of the display picture of the display panel 10 is further improved, and meanwhile, in the display stage, the difference caused by different distances between subpixels has no need to be considered for a color mixture result of light of three different colors and a target picture may be obtained merely by reasonably setting a sub-pixel voltage corresponding to brightness or a gray scale of a target mixed light.

Still referring to FIG. 5, the first virtual parallelogram 210 and the second virtual parallelogram 220 has a rhombus shape.

It should be noted that four sides of a rhombus are equal, that is, along the row direction X and the column direction Y of the matrix, a distance between geometric centers of any first sub-pixel 101 and any second sub-pixel 102 adjacent to the first virtual parallelogram is equal, further reducing influence of a color mixture difference caused by different distances on the display effect of the display panel 10 and facilitating the improvement of the display effect of the display panel 10.

Figure 6:
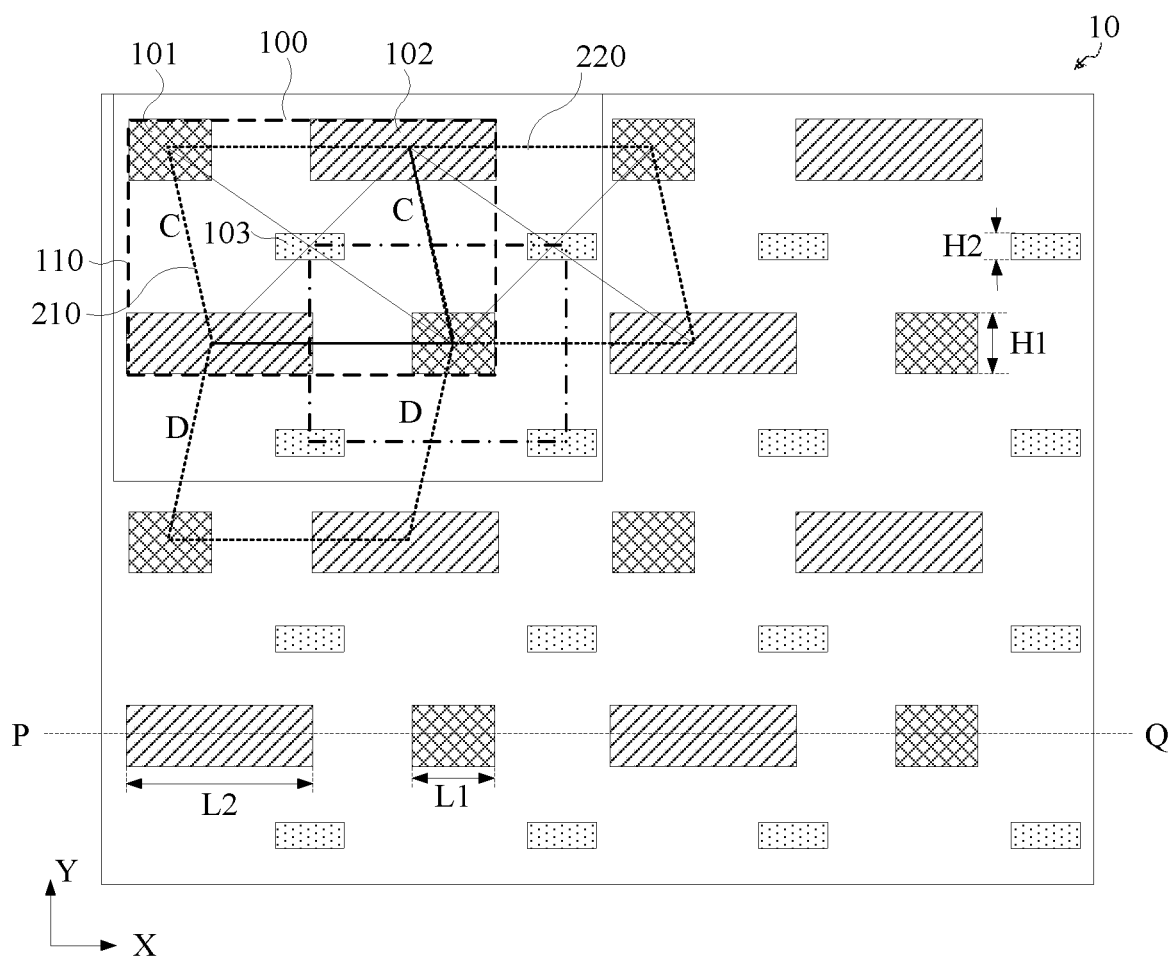
FIG. 6 is a structural diagram of another display panel according to an embodiment of the present disclosure.

FIG. 6 is a structural diagram of another display panel according to an embodiment of the present disclosure. A structure of the display panel 10 shown in FIG. 6 is similar to the structure of the display panel 10 shown in FIG. 4, and a difference lies in that the first sub-pixel 101 has a length of L1 and the second sub-pixel 102 has a length of L2, where L1<L2 and L2/L1≥2.

It should be noted that with such a design, the first virtual parallelogram 210 and the second virtual parallelogram 220 have greater obtuse angles and smaller acute angles, so that the first virtual parallelogram 210 and the second virtual parallelogram 220 deviate from the rectangle to a greater degree and have enhanced features of a parallelogram, thereby further facilitating color mixture between emitted light of different colors and making the display picture of the display panel 10 softer.

Optionally, the first sub-pixel 101 emits light of a first color, the second sub-pixel 102 emits light of a second color, and the third sub-pixel 103 emits light of a third color, where the first color, the second color and the third color are any one of red, green and blue colors separately and are different from each other.

It should be noted that since red, green and blue are three primary colors of light, and red, green and blue colors of different intensities can be mixed into light of various colors, the light emitting colors of the first sub-pixel 101, the second sub-pixel 102 and the third sub-pixel 103 are configured to be any one of the red, green and blue colors separately and different from each other, so that the display panel may have various display colors, enriching display colors of the display panel.

Exemplarily, the third color may be green.

It should be noted that in the pixel rendering process, the first sub-pixel 101 or the second sub-pixel 102 in any physical pixel unit will be used by another physical pixel unit to form the display pixel unit, so the first sub-pixel 101 and the second sub-pixel 102 each belong to two display pixel units; while each physical pixel unit includes one third sub-pixel 103; when the display pixel unit is formed, the third sub-pixel 103 in another physical pixel unit does not need to be used, and therefore the third sub-pixel 103 belongs to one display pixel unit. Because human eyes are more sensitive to green, the third color corresponding to the third sub-pixel 103 is configured to be green, so that when the display picture is observed with the human eyes, it is easy to distinguish between display pixel units, providing a higher visual resolution and a clearer visual picture.

In the present embodiment, a ratio of an area of a blue sub-pixel to an area of a red sub-pixel is K1, where 1<K1≤2.

It should be noted that due to influence of characteristics of materials forming the blue sub-pixel and the red sub-pixel, a service life of the blue sub-pixel is shorter than a service life of the red sub-pixel. In order to prevent a service life of the display panel 10 from being reduced due to the shorter service life of the blue sub-pixel, the blue sub-pixel is configured with a larger area, and therefore a current density of the blue sub-pixel is reduced, improving the service life of the blue sub-pixel. Meanwhile, in order to avoid a blue color cast due to too large an area of the blue sub-pixel when light of various colors is mixed, the ratio of the area of the blue sub-pixel to the area of the red sub-pixel is configured to be less than or equal to 2.

Furthermore, a ratio of the area of the red sub-pixel to an area of a green sub-pixel is K2, where 1<K2≤2.

It should be noted that due to influence of characteristics of materials forming the red sub-pixel and the green sub-pixel, the service life of the red sub-pixel is shorter than a service life of the green sub-pixel. In order to prevent the service life of the display panel 10 from being reduced due to the shorter service life of the red sub-pixel, the red sub-pixel is configured with a larger area, and therefore a current density of the red sub-pixel is reduced, improving the service life of the red sub-pixel. Meanwhile, in order to avoid a red color cast due to too large an area of the red sub-pixel when the light of various colors is mixed, the ratio of the area of the red sub-pixel to the area of the green sub-pixel is configured to be less than or equal to 2.

Furthermore, along the column direction of the matrix, a ratio of a width of the green sub-pixel to a width of the red sub-pixel is 1:2. Exemplarily, as shown in FIG. 6, the first sub-pixel 101 may be the red sub-pixel, the third sub-pixel 103 may be the green sub-pixel, and along the column direction Y of the matrix, a ratio of a width H2 of the third sub-pixel 103 to a width H1 of the first sub-pixel 101 is 1:2.

It should be noted that on a premise that a value range of the ratio K2 of the area of the red sub-pixel to the area of the green sub-pixel is 1<K2<2, with the configuration described above, lengths of the green sub-pixel are limited within an appropriate range and will not be too large along the row direction X and the column direction Y of the matrix, so that a geometric center of the green sub-pixel is closer to a center of the display pixel unit. Because the human eyes are more sensitive to green, and the green sub-pixel is a visual center of the display pixel unit, the human eyes can accurately distinguish between the display pixel units, ensuring that a visual resolution of the display pixel unit will not be decreased. Optionally, referring to FIG. 6, along the column direction Y of the matrix, the first sub-pixel 101 has a same width as the second sub-pixel 102.

It should be noted that with such a configuration, the first sub-pixel 101 and the second sub-pixel 102 in the same row have a same distance from an adjacent row of third sub-pixels, and a decrease limit of a distance between a row of third sub-pixels and an adjacent sub-pixel row can be limited by both the first sub-pixel 101 and the second sub-pixel 102, so that a case where when the decrease limit of the distance between the row of third sub-pixels and the adjacent sub-pixel row is merely limited by one of the first sub-pixel 101 or the second sub-pixel 102, an unoccupied non-display region is formed between the other of the first sub-pixel 101 or the second sub-pixel 102 and the row of third sub-pixels is avoided, and an occupied area of the non-display region in the display panel 10 is reduced, facilitating an increase of a pixel aperture ratio of the display panel 10.

Furthermore, still referring to FIG. 6, the first sub-pixel 101, the second sub-pixel 102 and the third sub-pixel 103 may be rectangular in shape.

It should be noted that according to the basic knowledge of geometry, after widths of the first sub-pixel 101, the second sub-pixel 102 and the third sub-pixel 103 in the row direction X and the column direction Y of the matrix are determined, an area of a rectangular sub-pixel is larger than an area of a sub-pixel with another shape, facilitating a further increase of the pixel aperture ratio of the display panel 10.

Figure 7:
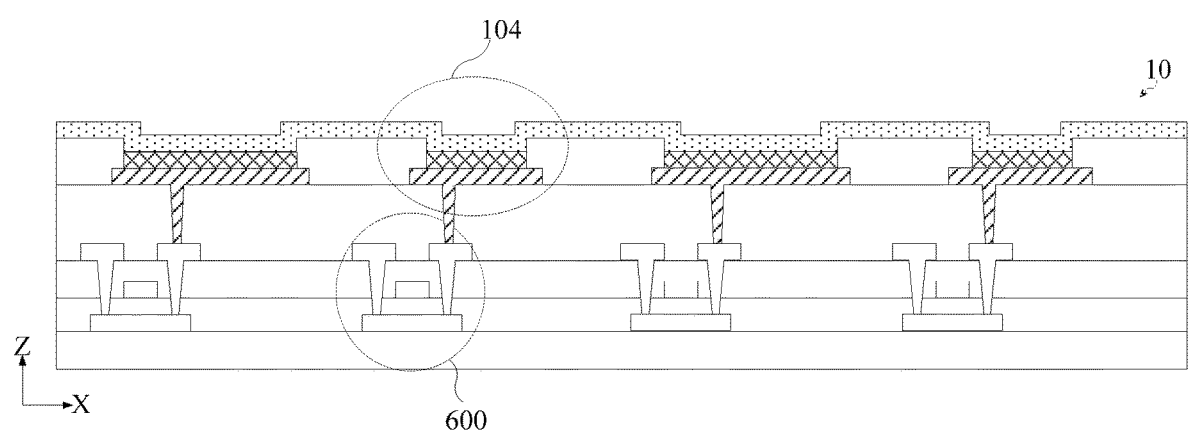
FIG. 7 is a sectional view taken along a dotted line PQ in FIG. 6.
Figure 8:
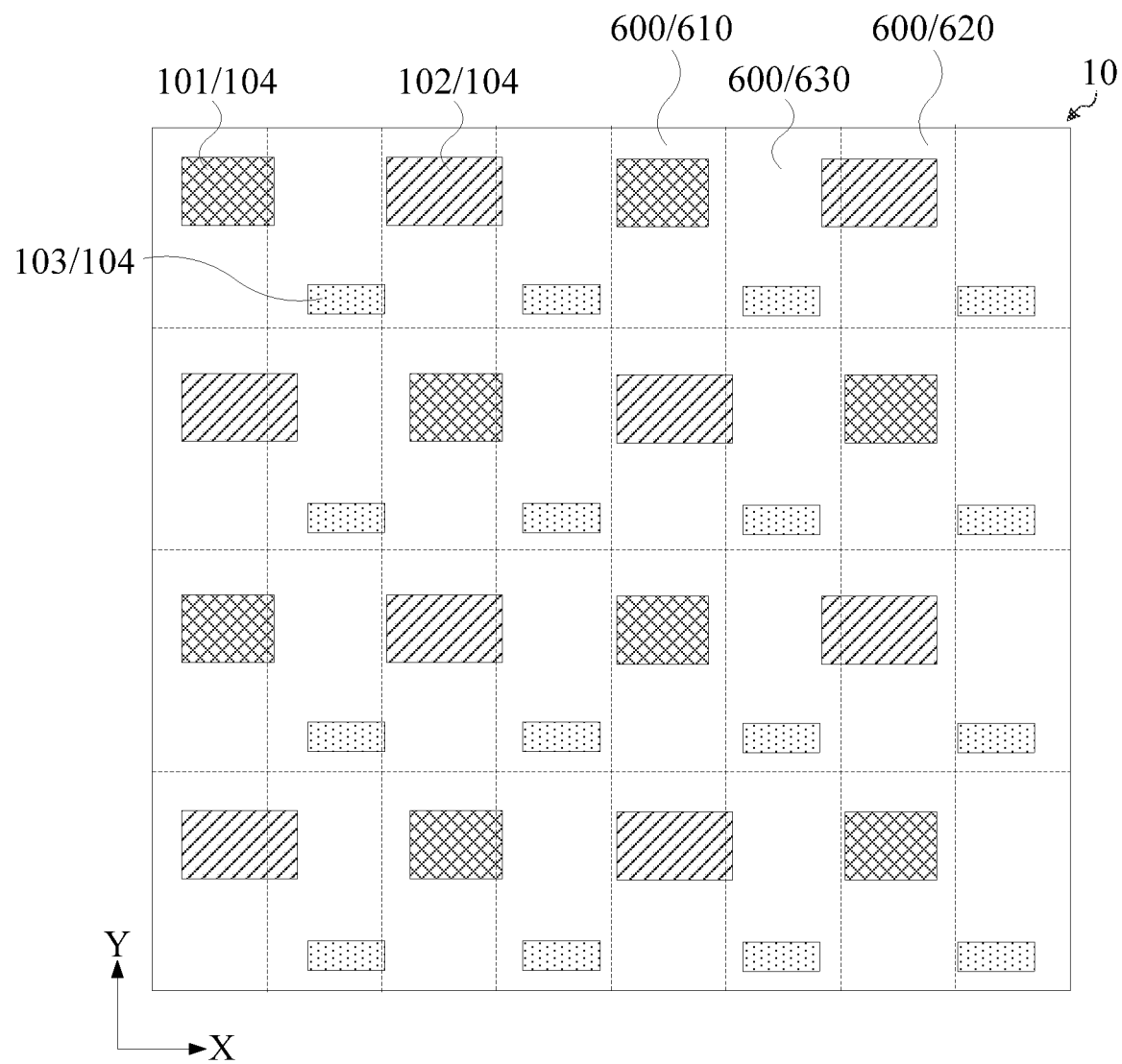
FIG. 8 is a structural diagram of another display panel according to an embodiment of the present disclosure.

FIG. 7 is a sectional view taken along a dotted line PQ in FIG. 6. FIG. 8 is a structural diagram of another display panel according to an embodiment of the present disclosure. As shown in FIG. 7 and FIG. 8, the display panel 10 further includes a plurality of pixel circuits 600, where the plurality of pixel circuits 600 are electrically connected to sub-pixels 104 in one-to-one correspondence, and along a light emitting direction Z of the sub-pixels 104, each pixel circuit 600 at least partially overlaps a sub-pixel 104 connected to the pixel circuit 600.

It should be noted that in order to simplify a structure of the drawing, FIG. 7 illustrates the corresponding pixel circuit 600 with a driving transistor, and it is to be understood that the pixel circuit 600 further includes components other than the driving transistor.

It should be further noted that along the light emitting direction Z of the sub-pixels 104, the pixel circuit 600 at least partially overlap the sub-pixel 104 connected to the pixel circuit 600; in this manner, while it is ensured that each sub-pixel 104 can be driven by the corresponding pixel circuit 600, the problem of a signal delay or loss due to too large a distance between the pixel circuit 600 and the corresponding sub-pixel 104 is avoided, so that the display panel 10 can normally work and has a good display effect.

Still referring to FIG. 8, the plurality of pixel circuits 600 include a plurality of first pixel circuits 610, a plurality of second pixel circuits 620 and a plurality of third pixel circuits 630, where the plurality of first pixel circuits 610 are electrically connected to first sub-pixels, the plurality of second pixel circuits 620 are electrically connected to second sub-pixels, and the plurality of third pixel circuits 630 are electrically connected to third sub-pixels.

Figure 9:
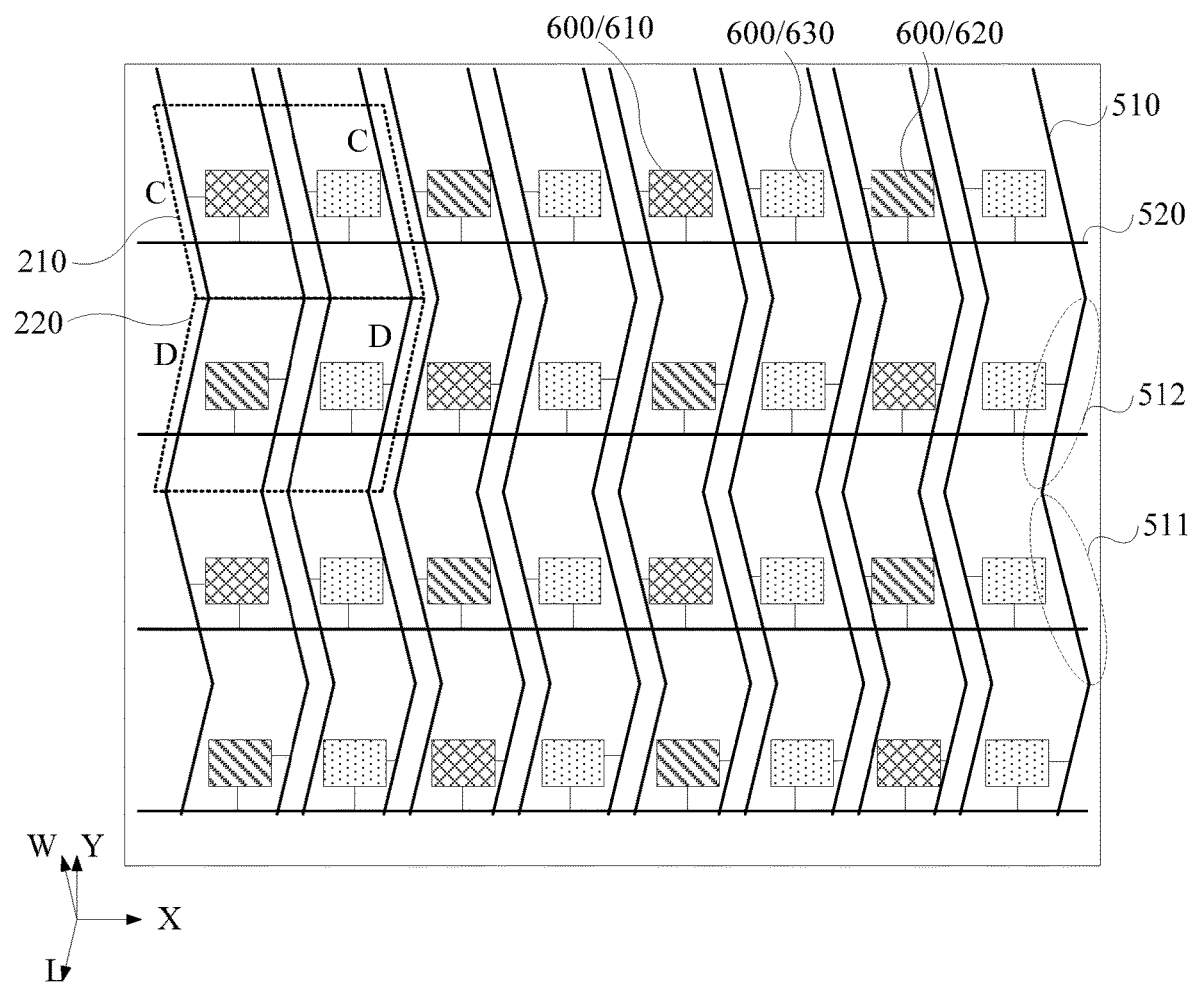
FIG. 9 is a schematic diagram of line connections of pixel circuits in a display panel according to an embodiment of the present disclosure.

FIG. 9 is a schematic diagram of line connections of pixel circuits in a display panel according to an embodiment of the present disclosure. It should be noted that in order to more clearly illustrate connection lines of the pixel circuits, FIG. 9 does not illustrate the sub-pixels, but illustrates the first virtual parallelogram 210 and the second virtual parallelogram 220 defined by geometric centers of sub-pixels; and the pixel circuits 600 are separated for display, and pixel circuits 600 connected to the first sub-pixel, the second sub-pixel and the third sub-pixel are respectively identified by same filling shadows as the first sub-pixel, the second sub-pixel and the third sub-pixel in FIG. 8.

As shown in FIG. 9, the first virtual parallelogram 210 includes two sides C which are opposite along the row direction X of the matrix and extend along a first direction W, and the second virtual parallelogram 220 in a same column as the first virtual parallelogram 210 includes two sides D which are opposite along the row direction X of the matrix and extend along a second direction L, where the first direction W and the second direction L each intersect the column direction Y of the matrix. The display panel further includes a plurality of data lines 510, where at least one of the plurality of data lines 510 includes a first section 511 and a second section 512. The first section 511 extends along the first direction W, and the second section 512 extends along the second direction L.

It should be noted that the plurality of data lines 510 are generally made of a metal material and have a light-shielding characteristic, so with the configuration manner described above, a plurality of stripe patterns with corresponding shapes are formed based on the plurality of data lines 510.

Optionally, still referring to FIG. 9, the display panel further includes a plurality of scanning lines 520, where the plurality of scanning lines 520 extend along the row direction X of the matrix, the plurality of pixel circuits 600 form a pixel circuit array, each row of pixel circuits 600 are electrically connected to one of the plurality of scanning lines 520, each column of pixel circuits 600 are connected to two of the plurality of data lines 510, each pixel circuit 600 is electrically connected to one data line 510, and at least two of pixel circuits 600 in a same column are connected to different data lines 510.

It should be noted that the plurality of data lines 510 and the plurality of scanning lines 520 are respectively configured to transmit data driving signals and scan driving signals for the sub-pixels electrically connected to the plurality of data lines 510 and the plurality of scanning lines 520, and the data driving signals and the scan driving signals cooperate to implement normal light emitting of the corresponding sub-pixels. In addition, the plurality of scanning lines 520 are also generally made of the metal material and have the light-shielding characteristic. The plurality of scanning lines 520 and the plurality of data lines 510 intersect to form a mesh structure. A mesh shape of the mesh structure is a parallelogram parallel to corresponding sides of the first virtual parallelogram 210 and the second virtual parallelogram 220 separately, under influence of extending directions of the plurality of scanning lines 520 and the plurality of data lines 510. In the structure of the display panel, a film structure other than the plurality of pixel circuits 600 generally has a light transmittance, so that each mesh opening of the mesh structure forms light-transmissive hole of a parallelogram. Exemplarily, an optical electronic element may be disposed on a side of the display panel facing away from a light emitting surface of the display panel and configured to implement corresponding element performance when receiving sufficient light. In this case, in an overlapping region between the display panel and the optical electronic component, the light-transmissive holes defined by the scanning lines 520 and the data lines 510 intersecting each other provide a light path through which light is incident into the optical electronic element from outside the display panel. For a display panel with a high pixel density, the light-transmissive hole has a very small size and can form a diffraction hole of light. In this embodiment, a shape of the light-transmissive hole is the parallelogram, and compared with a diffraction hole with another shape, the diffraction hole of the parallelogram corresponds to a diffraction field formed by light beam incidence whose intensity is significantly reduced, thereby effectively reducing influence of light diffraction on performance of the optical electronic element.

It should be further noted that for a high-resolution product, charging time distributed to each row of sub-pixels is reduced due to a larger pixel density. If charging time for the sub-pixels by the data driving signals is insufficient, when the sub-pixels emit light, currents cannot reach a set value, affecting the display effect. In this embodiment, each column of pixel circuits 600 are correspondingly connected to two data lines 510, and two parts of pixel circuits among the same column of pixel circuits 600 are connected to one data line 510 separately, so that in a practical display process, the two data lines 510 may simultaneously transmit different data driving signals, where one data line 510 among the two data lines 510 is configured to charge corresponding pixel circuits 600, and the other data line 510 is configured to pre-charge corresponding pixel circuits, so as to reduce charging time of each sub-pixel row through a pre-charging manner. The pre-charging manner at least ensures that a pre-charged pixel circuit 600 can be fully charged, avoids the problem that most sub-pixels are insufficiently charged since a single data line 510 charges a single column of pixel circuits 600, and improves the display effect of the display panel.

Optionally, still referring to FIG. 9, in the pixel circuit array, pixel circuits 600 in an odd-numbered row are connected to one of two data lines 510 among the plurality of data lines 510, and pixel circuits 600 in an even-numbered row is connected to the other one of the two data lines 510.

It should be noted that with such a configuration, in the practical display process, when a pixel circuit 600 in this row is charged by one of the two data lines 510 after a gate of its switching transistor is turned on, a pixel circuit 600 in a next row may be pre-charged by the other one of the two data lines 520, that is, the two data lines 510 may be configured to implement fast and sufficient charging of each sub-pixel in the column of sub-pixels, further improving the display effect of the display panel.

Figure 10:
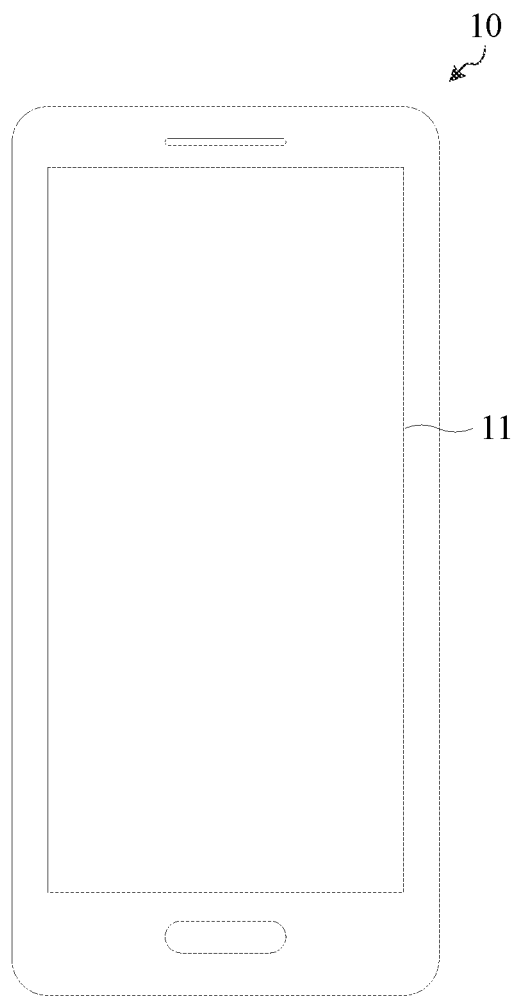
FIG. 10 is a structural diagram of a display device according to an embodiment of the present disclosure.

FIG. 10 is a structural diagram of a display device according to an embodiment of the present disclosure. As shown in FIG. 10, a display device 10 includes a display panel 11 according to any one of the embodiments of the present disclosure. Since the display device 10 provided by the present embodiment includes the display panels 11 according to any one of the embodiments of the present disclosure, the display device 10 has same or corresponding beneficial effects as the display panel 11 included in the display device 10, and details are not repeated herein.

It is to be noted that the above are merely preferred embodiments of the present disclosure and the technical principles used therein. It can be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising a plurality of repeating units arranged in a matrix;
   wherein each of the plurality of repeating units comprises two first sub-pixels, two second sub-pixels and four third sub-pixels, wherein each of the two first sub-pixels, each of the two second sub-pixels and each of the four third sub-pixels emit light of different colors;
   wherein the two first sub-pixels and the two second sub-pixels form an arrangement with two rows and two columns, a row direction and a column direction of the arrangement are parallel to a row direction and a column direction of the matrix respectively, and two sub-pixels in a same row or a same column emit light of different colors;
   wherein outer edges of the two first sub-pixels and the two second sub-pixels are located on a same first virtual rectangle, and geometric centers of the two first sub-pixels and the two second sub-pixels form a first virtual parallelogram; and
   wherein geometric centers of the four third sub-pixels form a second virtual rectangle, one side of the second virtual rectangle is parallel to the row direction or the column direction of the matrix, wherein a geometric center of the first virtual parallelogram coincides with a geometric center of one of the four third sub-pixels, and the other three of the four third sub-pixels are located on the second virtual rectangle and on one side of the first virtual parallelogram facing away from a geometric center of the first virtual parallelogram;
   wherein along the row direction and the column direction of the matrix, geometric centers of two first sub-pixels and two second sub-pixels located on opposite sides of two adjacent first virtual parallelograms form a second virtual parallelogram;
   wherein one of the four third sub-pixels is located inside the second virtual parallelogram, and a geometric center of the second virtual parallelogram coincides with a geometric center of the one of the four third sub-pixels inside the second virtual parallelogram;
   wherein along the row direction of the matrix, the first virtual parallelogram and the second virtual parallelogram adjacent to the first virtual parallelogram coincide by performing a translation on the first virtual parallelogram along the row direction of the matrix; and
   wherein along the column direction of the matrix, the first virtual parallelogram and the second virtual parallelogram adjacent to the first virtual parallelogram are mirror-symmetrical about a virtual straight line, wherein the virtual straight line is parallel to the row direction of the matrix; and
   wherein along the row direction of the matrix, the each of the two first sub-pixels has a length of L1 and the each of the two second sub-pixels has a length of L2, wherein L1<L2 and L2/L1≥2.

2. The display panel of claim 1, wherein each of the first virtual parallelogram and the second virtual parallelogram has a rhombus shape.

3. The display panel of claim 1, wherein along the column direction of the matrix, the each of the two first sub-pixels has a same width as the each of the two second sub-pixels.

4. The display panel of claim 1, wherein the each of the two first sub-pixels, the each of the two second sub-pixels and the each of the four third sub-pixels have a rectangular shape.

5. The display panel of claim 1, further comprising a plurality of pixel circuits, wherein the plurality of pixel circuits are electrically connected to sub-pixels of the plurality of repeating units in one-to-one correspondence; and along a light-emitting direction of the sub-pixels, each of the plurality of pixel circuits at least partially overlaps a sub-pixel connected to the each of the plurality of pixel circuits.

6. The display panel of claim 5, wherein the first virtual parallelogram comprises two sides extending along a first direction, wherein the two sides of the first virtual parallelogram are opposite to each other along the row direction of the matrix;
   wherein the second virtual parallelogram in a same column as the first virtual parallelogram comprises two sides extending along a second direction, wherein the two sides of the second virtual parallelogram are opposite to each other along the row direction of the matrix, wherein the first direction and the second direction each intersect the column direction of the matrix; and
   wherein the display panel further comprises a plurality of data lines, wherein at least one of the plurality of data lines comprises a first section and a second section, wherein the first section extends along the first direction, and the second section extends along the second direction.

7. The display panel of claim 6, further comprising a plurality of scanning lines,
   wherein the plurality of scanning lines extend along the row direction of the matrix;
   wherein the plurality of pixel circuits form a pixel circuit array, each row of the plurality of pixel circuits are electrically connected to one of the plurality of scanning lines, each column of the plurality of pixel circuits are connected to two data lines of the plurality of data lines, the each of the plurality of pixel circuits is electrically connected to one of the plurality of data lines, and at least two of pixel circuits in a same column are connected to different data lines.

8. The display panel of claim 7, wherein in the pixel circuit array, pixel circuits in an odd-numbered row of the each column of the plurality of pixel circuits are connected to one of the two data lines, and pixel circuits in an even-numbered row of the each column of the plurality of pixel circuits are connected to the other one of the two data lines.

9. A display panel, comprising a plurality of repeating units arranged in a matrix;
wherein each of the plurality of repeating units comprises two first sub-pixels, two second sub-pixels and four third sub-pixels, wherein each of the two first sub-pixels, each of the two second sub-pixels and each of the four third sub-pixels emit light of different colors;
wherein the two first sub-pixels and the two second sub-pixels form an arrangement with two rows and two columns, a row direction and a column direction of the arrangement are parallel to a row direction and a column direction of the matrix respectively, and two sub-pixels in a same row or a same column emit light of different colors;
wherein outer edges of the two first sub-pixels and the two second sub-pixels are located on a same first virtual rectangle, and geometric centers of the two first sub-pixels and the two second sub-pixels form a first virtual parallelogram; and
wherein geometric centers of the four third sub-pixels form a second virtual rectangle, one side of the second virtual rectangle is parallel to the row direction or the column direction of the matrix, wherein a geometric center of the first virtual parallelogram coincides with a geometric center of one of the four third sub-pixels, and the other three of the four third sub-pixels are located on the second virtual rectangle and on one side of the first virtual parallelogram facing away from a geometric center of the first virtual parallelogram;
wherein the each of the two first sub-pixels emits light of a first color, the each of the two second sub-pixels emits light of a second color, and the each of the four third sub-pixels emits light of a third color;
wherein the first color, the second color and the third color are different from each other, and each of the first color, the second color and the third color is one of red, green and blue colors;
wherein the third color is green;
wherein a ratio of an area of a blue sub-pixel to an area of a red sub-pixel is K1, wherein 1<K1≤2.

10. The display panel of claim 9, wherein a ratio of the area of the red sub-pixel to an area of a green sub-pixel is K2, wherein 1<K2≤2.

11. The display panel of claim 10, wherein along the column direction of the matrix, a ratio of a width of the green sub-pixel to a width of the red sub-pixel is 1:2.

12. The display panel of claim 9, wherein along the column direction of the matrix, the each of the two first sub-pixels has a same width as the each of the two second sub-pixels.

13. The display panel of claim 9, wherein the each of the two first sub-pixels, the each of the two second sub-pixels and the each of the four third sub-pixels have a rectangular shape.

14. A display device, comprising a display panel,
wherein the display panel comprises: a plurality of repeating units arranged in a matrix;
wherein each of the plurality of repeating units comprises two first sub-pixels, two second sub-pixels and four third sub-pixels, wherein each of the two first sub-pixels, each of the two second sub-pixels and each of the four third sub-pixels emit light of different colors;
wherein the two first sub-pixels and the two second sub-pixels form an arrangement with two rows and two columns, a row direction and a column direction of the arrangement are parallel to a row direction and a column direction of the matrix respectively, and two sub-pixels in a same row or a same column emit light of different colors;
wherein outer edges of the two first sub-pixels and the two second sub-pixels are located on a same first virtual rectangle, and geometric centers of the two first sub-pixels and the two second sub-pixels form a first virtual parallelogram; and
wherein geometric centers of the four third sub-pixels form a second virtual rectangle, one side of the second virtual rectangle is parallel to the row direction or the column direction of the matrix, wherein a geometric center of the first virtual parallelogram coincides with a geometric center of one of the four third sub-pixels, and the other three of the four third sub-pixels are located on the second virtual rectangle and on one side of the first virtual parallelogram facing away from a geometric center of the first virtual parallelogram;
wherein the each of the two first sub-pixels emits light of a first color, the each of the two second sub-pixels emits light of a second color, and the each of the four third sub-pixels emits light of a third color;
wherein the first color, the second color and the third color are different from each other, and each of the first color, the second color and the third color is one of red, green and blue colors;
wherein the third color is green;
wherein a ratio of an area of a blue sub-pixel to an area of a red sub-pixel is K1, wherein 1<K1≤2.

* * * * *